(12) United States Patent
Quinlan

(10) Patent No.: US 7,119,321 B2
(45) Date of Patent: Oct. 10, 2006

(54) OPTICAL CHANNELS FOR MULTI-LEVEL METAL OPTICAL IMAGERS

(75) Inventor: Sion C. Quinlan, Oxon (GB)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 10/610,680

(22) Filed: Jul. 2, 2003

(65) Prior Publication Data

US 2005/0001146 A1   Jan. 6, 2005

(30) Foreign Application Priority Data

Jul. 1, 2003 (GB) ................ 0315389.7

(51) Int. Cl.
*G02B 27/10* (2006.01)
(52) U.S. Cl. .................... 250/214.1; 348/340
(58) Field of Classification Search ............ 250/208.1, 250/226, 214, 214.1; 348/340; 257/232, 257/233
See application file for complete search history.

(56) References Cited

U.S. PATENT DOCUMENTS 6,495,895 B1   12/2002   Peterson et al.

6,512,861 B1   1/2003   Chakravorty et al.
2004/0004668 A1*   1/2004   Namazue ............... 348/340

FOREIGN PATENT DOCUMENTS

| EP | 1 341 235 A2 |   | 9/2003 |
|---|---|---|---|
| JP | 03-276677 | * | 6/1991 |
| JP | 3276677 A |   | 6/1991 |
| JP | 2002246579 A |   | 8/2002 |

* cited by examiner

Primary Examiner—Thanh X. Luu
Assistant Examiner—Tony Ko
(74) Attorney, Agent, or Firm—Dickstein Shapiro LLP

(57) ABSTRACT

The manufacture of multi-level optical imagers and the resulting imagers are described. Multiple levels of metallization are prepared, each level having a via. The vias are aligned and a material having a higher refractive index than its surrounds is positioned within the vias to form an optical channel. The higher refractive index material may be an optical plug. A lens is mounted at one end of the optical channel and a photoconversion device is mounted at the other end.

37 Claims, 5 Drawing Sheets

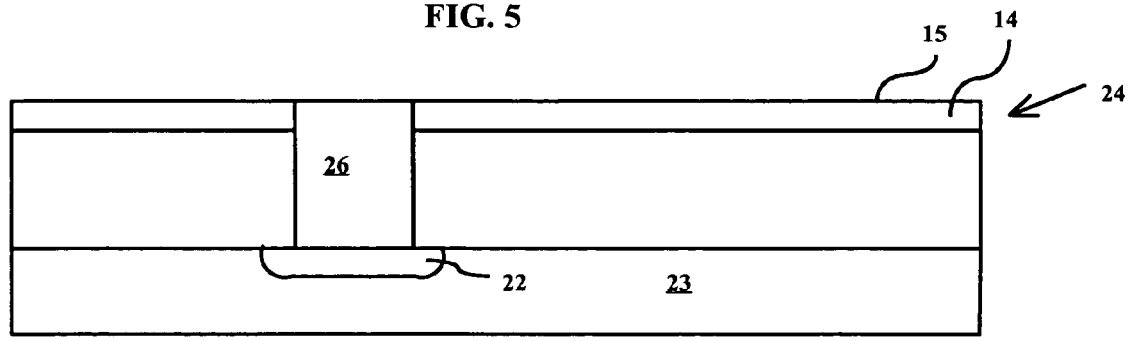
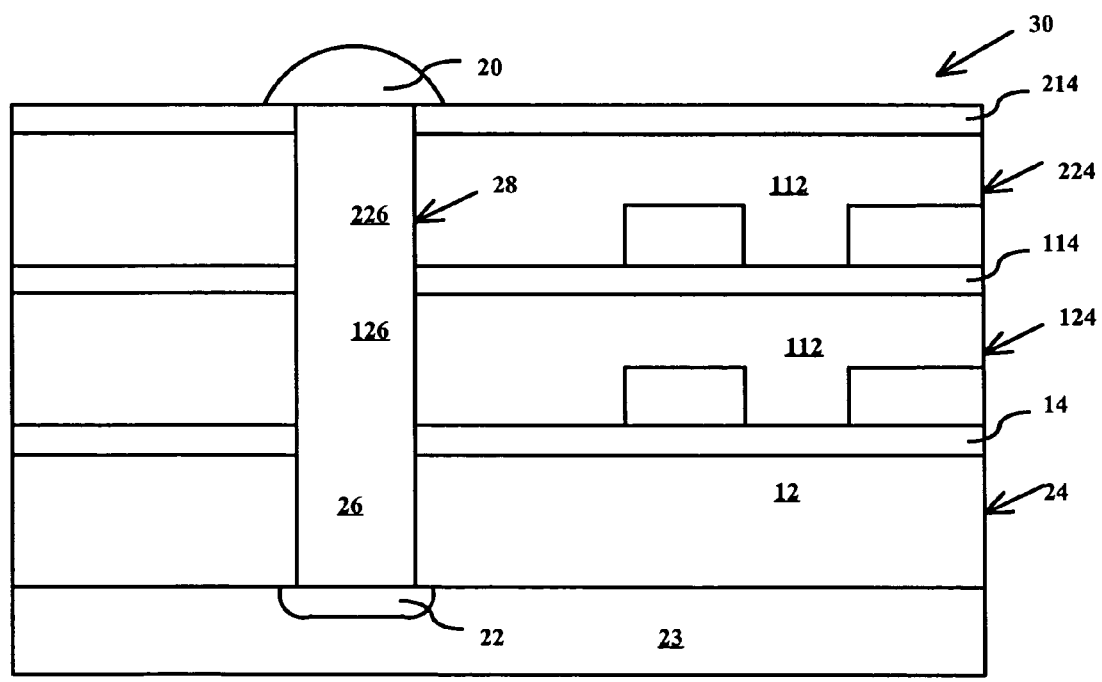

OPTICAL CHANNELS FOR MULTI-LEVEL METAL OPTICAL IMAGERS

FIELD OF THE INVENTION

The present invention relates generally to the field of metal optical imagers, and more particularly to optical channels utilized in multi-level metal optical imagers.

BACKGROUND

The semiconductor industry currently uses different types of semiconductor-based imagers, such as, for example, complementary metal oxide semiconductor (CMOS) imagers, charge coupled devices (CCDs), photodiode arrays, charge injection devices and hybrid focal plane arrays, among others. The above noted examples of semiconductor imagers incorporate solid state pixels that receive an image, from lenses or other light-receiving structures, with sensors and convert that image to electrical signals.

Semiconductor imagers all require at least one level and up to three levels of metallization to connect transistors for the pixels to the circuitry that drives the pixels. The levels of metallization must be properly insulated and are generally within an intralayer dielectric material. An undesirable aspect of incorporating plural levels of metallization is that the light attenuates as the distance between the lens and the sensor increases.

SUMMARY

The various embodiments of the invention are directed to improving the transmission of light to a light device of a pixel cell of a digital imager or from a pixel cell of a display device. Embodiments of the present invention provide an optical imager that includes a lens, a light device, a first dielectric material, and a second dielectric material extending through the first dielectric material. The second dielectric material exhibits a refractive index greater than the refractive index exhibited by the first dielectric material and serves as an optical channel optically connecting the lens with the light device.

Other embodiments of the present invention provide an optical coupling between a lens and a light device. The optical coupling includes a via extending between the lens and the light device, a first optical channel section extending through a portion of the via, and at least a second optical channel section extending through the remainder of the via. The optical channel sections exhibit a refractive index greater than the material surrounding the optical channel sections.

Other embodiments of the present invention provide a multi-level optical imager that includes a plurality of intermediate structures built over a pixel cell, a lens, and a light device within the pixel cell. Each intermediate structure includes a dielectric material portion, a stop layer capping the dielectric material portion, and an optical channel section extending through the dielectric material portion and the stop layer. The optical channel sections are aligned with each other to form an optical channel optically connecting the lens with the light device.

Other embodiments of the present invention provide an optical imager including a lens, a light device, and at least one metallized layer structure. The at least one metallized layer structure includes a first dielectric material, a metallized portion within the first dielectric material, and a second dielectric material extending through the first dielectric material. The second dielectric material exhibits a refractive index greater than the refractive index exhibited by the first dielectric material and serving as an optical channel optically connecting the lens with the light device.

Other embodiments of the present invention provide a method of manufacturing an optical imager. The method includes forming a base intermediate structure over a pixel cell, the base intermediate structure including a first optical channel section within a dielectric material, forming one or more secondary intermediate structures on the base intermediate structure, each of the secondary intermediate structures including a second optical channel section aligned with the first optical channel section to form an optical channel, and optically connecting a lens at one end of the optical channel with a light device of the pixel cell at the other end of the optical channel.

Other embodiments of the present invention provide a method of forming a multi-level optical imager. The method includes the acts of forming a base intermediate structure over a pixel cell, forming one or more secondary intermediate structures over the base intermediate structure, and optically connecting a lens at one end of an optical channel with a light device at the other end of the optical channel. The act of forming the base intermediate structure includes forming a first dielectric material portion including a first dielectric material over the light device in the pixel cell, forming a stop layer on the first dielectric material, forming a via through the stop layer and the first dielectric material to the light device, filling the via with a second dielectric material to form a first optical channel section that exhibits a refractive index greater than the refractive index exhibited by the first dielectric material, and planarizing the second dielectric material with a surface of the stop layer. The act of forming one or more secondary intermediate structures over the base intermediate structure includes patterning a metallized portion over the base intermediate structure, forming a second dielectric material portion including the first dielectric material over the metallized portion, forming a stop layer over the second dielectric material portion, forming a via through the stop layer and the second dielectric material portion, filling the via with the second dielectric material to form a second optical channel section in alignment with the first optical channel section, and planarizing the second dielectric material portion with a surface of the stop layer. The second optical channel section exhibits a refractive index greater than the refractive index exhibited by the second dielectric material.

Other embodiments of the present invention provide an optical imager including a lens, a light device, a first dielectric material having a via, and an optical plug introduced in the via of the first dielectric material. The optical plug serves as an optical channel optically connecting the lens with the light device.

Other embodiments of the present invention provide a multi-level optical imager that includes a first intermediate structure, a second intermediate structure, a lens and a light device. The first intermediate structure includes a first dielectric material portion, a first stop layer over the first dielectric material portion, and a first optical channel section extending through the first dielectric material portion and the first stop layer. The first optical channel section includes an optical plug. The second intermediate structure includes a second dielectric material portion, a second stop layer over the second dielectric material portion, and a second optical channel section extending through the second dielectric material portion and the second stop layer to the optical plug. The first intermediate structure is mounted over the light device The first and second optical channel sections are aligned with each other to form an optical channel optically connecting the lens with the light device.

Other embodiments of the present invention also provide a method of forming a multi-level optical imager that includes the acts of forming a first intermediate structure over a light device of a pixel cell, forming a second intermediate structure over the first intermediate structure, and optically connecting a lens with the light device. The act of forming a first intermediate structure includes forming a first dielectric material portion over the pixel cell, forming a first stop layer over the first dielectric material portion, forming a first via through the first stop layer and the first dielectric material portion to the light device, and plugging the first via with an optical plug to form a first optical channel section that exhibits a refractive index greater than the refractive index exhibited by the first dielectric material portion. The act of forming a second intermediate structure includes patterning a metallized portion on the first intermediate structure, forming a second dielectric material portion over the metallized portion, forming a second stop layer over the second dielectric material portion, forming a second via through the second stop layer and the second dielectric material portion, wherein the second via is aligned with the first optical channel section, filling the second via with a second dielectric material to form a second optical channel section that exhibits a refractive index greater than the refractive index exhibited by the second dielectric material portion, and planarizing the second dielectric material with a surface of the second stop layer.

The inventions can be used to not only channel light to a pixel cell of a digital imager, but also to channel emitted light from pixel cells of a display device. These and other features of the invention will be more readily understood from the following detailed description of the invention which is provided in connection with the accompanying drawings.

BRIEF DESCRIPTION OF THE DRAWINGS

FIG. 5 is a view of the low refractive index material of FIG. 1 with the higher refractive index material polished down to the stop layer.

FIG. 6 is a view of a multi-level metal optical imager including the single metallized level of FIG. 1.

DETAILED DESCRIPTION OF PREFERRED EMBODIMENTS

The various embodiments described herein illustrate the inventions in the context of channeling exterior light onto a pixel cell photosensor of a digital imager. However, the invention also can be used with a digital display device having light emitting pixel cells to channel light from the pixels cells to the exterior of the display device.

Figure 7:
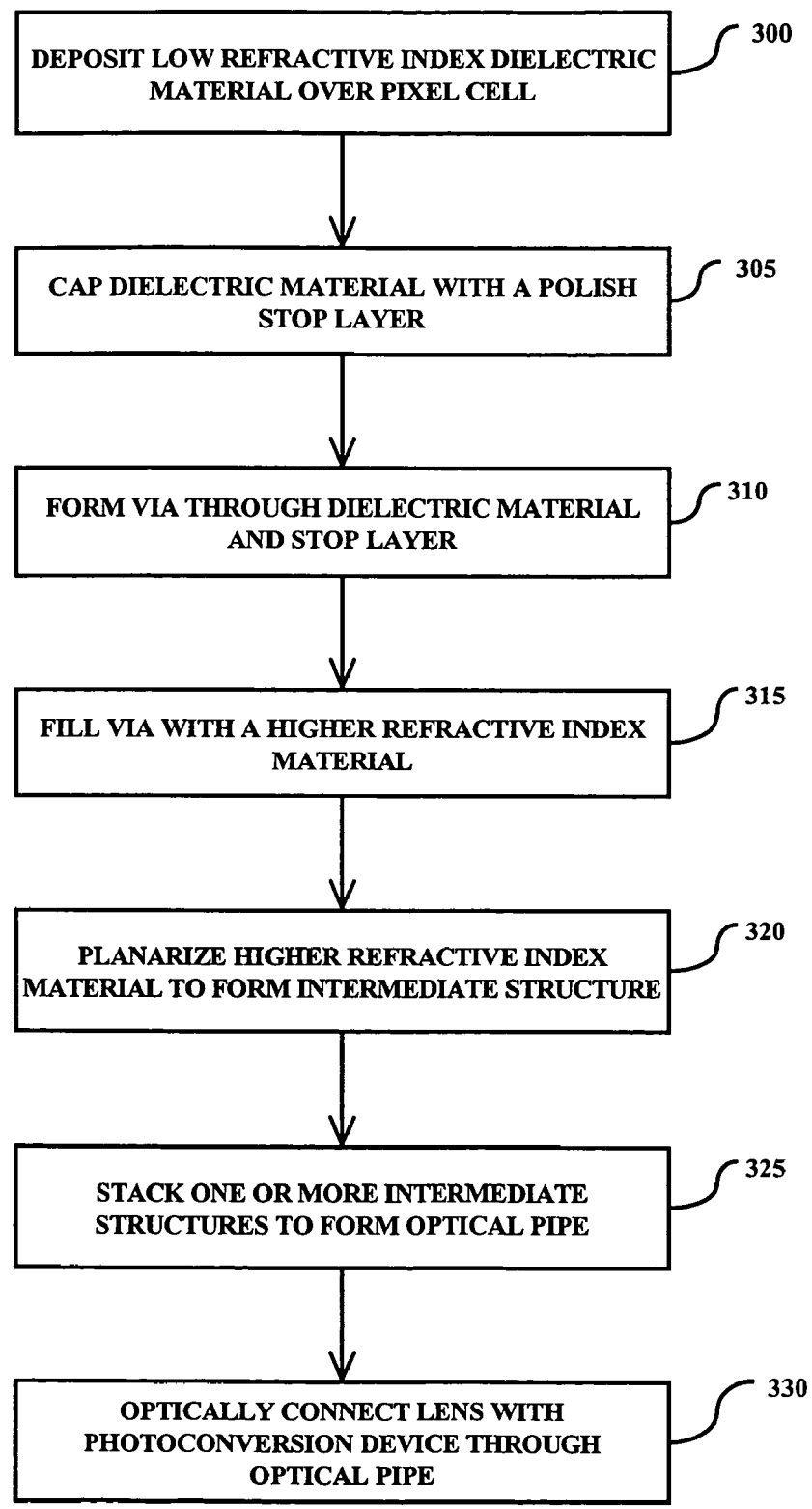
FIG. 7 illustrates a process of forming The multi-level metal optical imager of FIG. 6.

FIGS. 1–6 illustrate the formation of a multi-level metal optical imager, and FIG. 7 describes the process of forming such an imager. The process described with reference to FIGS. 1–7 can be used in the manufacture of, for example, CMOS imagers charge. coupled devices (CCDs), photodiode arrays, charge injection devices, hybrid focal plane arrays, and other types of digital imagers, as well as display devices. At an initial Step 300 (FIG. 7), a low refractive index dielectric material 12 is deposited over a light device 22 formed in a pixel cell 23 (FIG. 1) of a substrate. For clarity of illustration, only the light device 22 of the pixel cell 23 is illustrated. It should be appreciated that the light device 22 may be a photoconversion device (such as a photodiode or a photogate) for a digital imager, or the light device 22 may be a light emitting device for a digital display device.

The dielectric material 12 may be planarized through any suitable process, such as a chemical mechanical polishing process. The dielectric material 12 is preferably a material exhibiting a low dielectric constant (K), meaning one with a dielectric constant no greater than about 4.0. Suitable examples of a material for forming a low dielectric K, low refractive index material 12 are optically transparent materials having a low refractive index that are compatible with semiconductor processing, such as, for example, HOSP™ (K of 2.5), GX-3™ (K of 2.65), and NANOGLASS® (K of 2.2), all marketed by Honeywell. However, it should be appreciated that higher dielectric constant materials (those with K greater than about 4.0) may also be suitable as the dielectric material 12.

Figure 1:
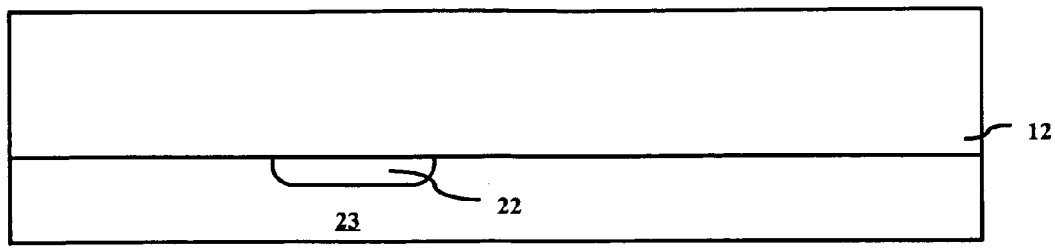
FIG. 1 is a view of a single metallized level patterned within a low refractive index material in accordance with a first exemplary embodiment of the invention.
Figure 2:
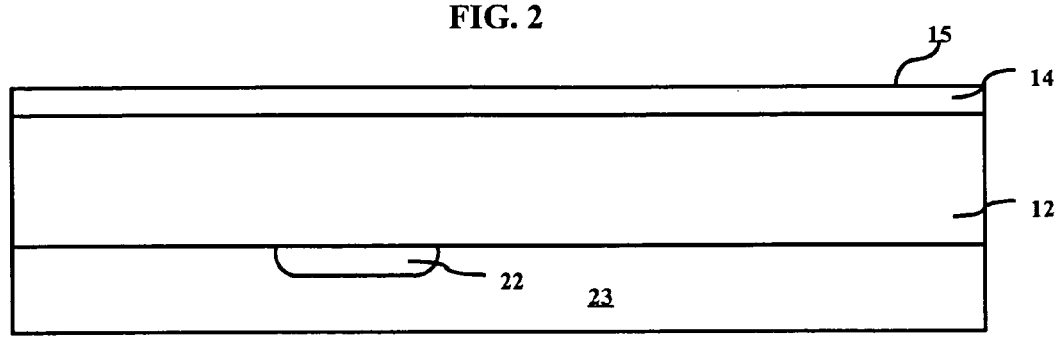
FIG. 2 is a view of the low refractive index material of FIG. 1 capped with a stop layer.
Figure 3:
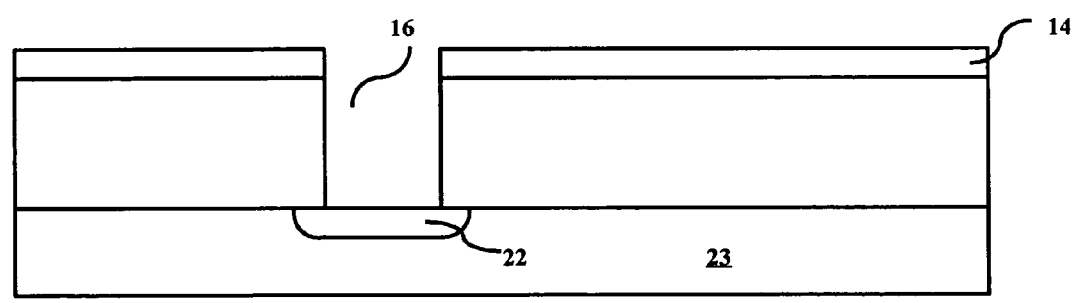
FIG. 3 is a view of the low refractive index material of FIG. 1 with a via extending therethrough.

Next, at Step 305, a polish stop layer 14 is formed on the dielectric material 12 (FIG. 2). The polish stop layer 14 is formed of a material which is adapted to inhibit chemical-mechanical polishing, such as, for example, silicon nitride. The polish stop layer 14 includes a surface 15. At Step 310, a via 16 is formed through the polish stop layer 14 and the dielectric material 12 (FIG. 3) down to the light device 22. Preferably, the via 16 is formed by the use of a mask and an etching material. Specifically, the via 16 is first patterned with a mask and then etched into the polish stop layer 14 and the dielectric material 12. The polish stop layer 14 serves to prevent the etching material from etching too much laterally into the dielectric material 12.

Figure 4:
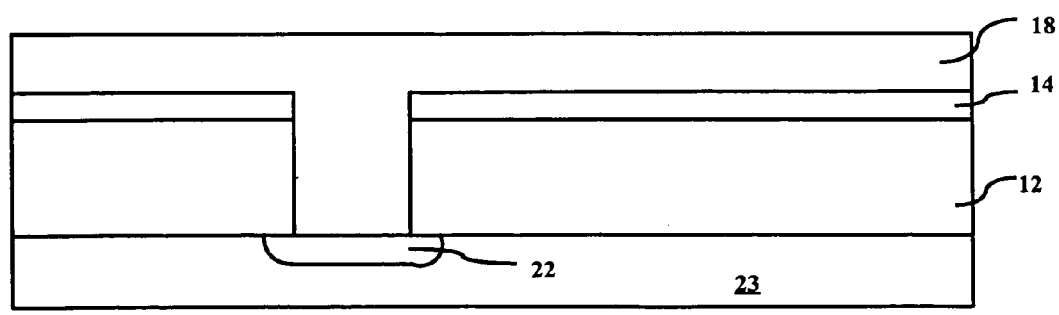
FIG. 4 is a view of a higher refractive index material capping the low refractive index material of FIG. 1.

At Step 315, a second dielectric material 18 is formed over the polish stop layer 14 (FIG. 4). Preferably, the second dielectric material 18 is deposited on the surface 15 of the polish stop layer 14, allowing the second dielectric material 18 to fill the via 16. The second dielectric material 18 has a higher refractive index than the dielectric material 12. Examples of suitable high refractive index materials include silicon dioxide, silicon nitride, silicates, phosphosilicates, methylsiloxanes, and organic polymers, and other optically transparent materials compatible with semiconductor processing, where the refractive indices range from 1.39 to 1.83. It is important that the ratio of the refractive indices of the first and second dielectric materials 12 and 18 be sufficient to cause total internal reflection. The equation for total internal reflection is:

$$\sin(\theta) = N_1/N_2$$

where $\theta$ is the critical angle, $N_1$ is the material having the higher refractive index (namely the second dielectric material 18), and $N_2$ is the material with the lower refractive index (the first dielectric material 12).

Table 1 provides a non-exclusive selection of suitable $N_1$ and $N_2$ materials

1

| Refractive Index for $N_1$ Material | Refractive Index for $N_2$ Material | Critical Angle | $N_1$ Dielectric Constant | $N_2$ Dielectric Constant |
|---|---|---|---|---|
| 1.63 Alumina | 1.43 (Silicon dioxide) | 60 | about 10 | 4.5 |
| 1.43 (Silicon dioxide) | 1.39 (Oxysilane) | 76 | 4.5 | Variable |
| 1.83 (Silicon nitride) | 1.43 (Silicon dioxide) | 51 | 7.5 | 4.5 |

At Step 320, the second dielectric material 18 is planarized down to the surface 15 of the polish stop layer 14, removing the second dielectric material 18 from everywhere except within the via 16. The structure thus formed is a base intermediate structure 24 (FIG. 5). Next, at Step 325, one or more secondary intermediate structures are built or stacked on top of the base intermediate structure 24 and each other to form an optical channel 28 (FIG. 6). As shown in FIG. 6, two secondary intermediate structures 124 and 224 are shown to have been built on the intermediate structure 24 to form the optical channel 28 including optical channel sections 26, 126, 226. The secondary intermediate structures 124 and 224, which respectively include polish stop layers 114 and 214, are built in a similar manner as the base intermediate structure 24. However, the dielectric materials 112 and 212 each also isolate patterned metallization portions 10 which may be provided over the polish stop layers 14 and 114.

It should be appreciated that the dielectric materials 112 and 212 may be formed of the same or a different material than the dielectric material 12. The limit on the number of intermediate structures, and hence, the number of levels of metallization is controlled by the sensitivity of the transistor/amplifier combination of the pixel cell 23 and the absorption of the dielectric material used as the optical channel 28.

To ascertain whether there is total internal reflection, the ratio of refractive indices of each material in each intermediate structure is checked. Thus, the aforementioned equation becomes:

$$\sin(\theta_A) = N_{26}/N_{12}$$

$$\sin(\theta_B) = N_{126}/N_{112}$$

$$\sin(\theta_C) = N_{226}/N_{212}.$$

It should be appreciated that, while it is preferable in certain instances for the critical angle $\theta_A$ to equal the critical angles $\theta_B$ and $\theta_C$, there may be reasons why the critical angles differ. Obviously, if the dielectric materials 112 and 212 are made of a different material than the dielectric material 12, then the critical angles $\theta_B$ and $\theta_C$ likely will be different than the critical angle $\theta_A$.

In an alternative aspect of the process illustrated in FIG. 7, Step 325 (stacking or building the intermediate structures 24, 124, 224 to form the optical channel 28) can immediately follow Step 305 (positioning the stop layers 14, 114, 214 over, respectively, the dielectric materials 12, 112, 212) and then a via can be formed (Step 310), such as by etching or drilling, through all the intermediate structures 24, 124, 224 down to the light device 22. Afterward, the via can be filled with the higher refractive index material (Step 315) to form the optical channel 28.

At Step 330, a lens 20 is formed at one end of the optical channel 28 and optically connected through the optical channel 28 with the light device 22, which may be a photodiode or photogate. The optical channel 28 acts as an optical pathway between the lens 20 and the light device 22. The structure thus formed has a plurality of metallized layers, two being shown in FIG. 6, with an optical channel connection between the lens 20 and the light device 22. The structure illustrated in FIG. 6 includes three intermediate structures (24, 124, 224) with first, second and third dielectric material portions 12, 112, 212 surrounding the optical channel 28 which has a greater refractive index than the dielectric material surrounding it. It should be appreciated that the exemplary structure illustrated in FIG. 6 may have fewer or more than the three intermediate structures 24, 124, 224 shown.

Figure 8:
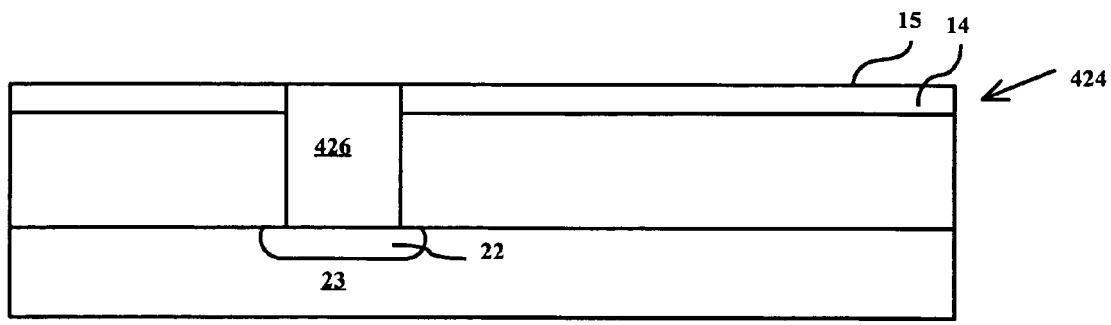
FIG. 8 is a view of an intermediate structure having a low refractive index material and a higher refractive index optical plug in accordance with a second exemplary embodiment of the invention.
Figure 9:
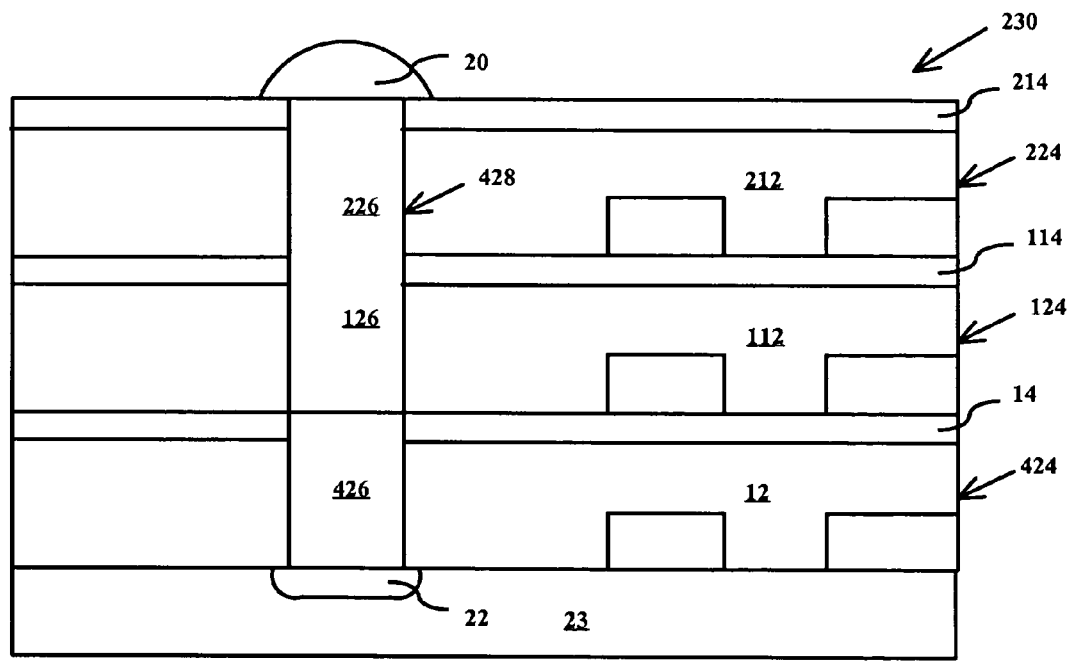
FIG. 9 is a view of a multi-level optical imager including the intermediate structure of FIG. 8.
Figure 10:
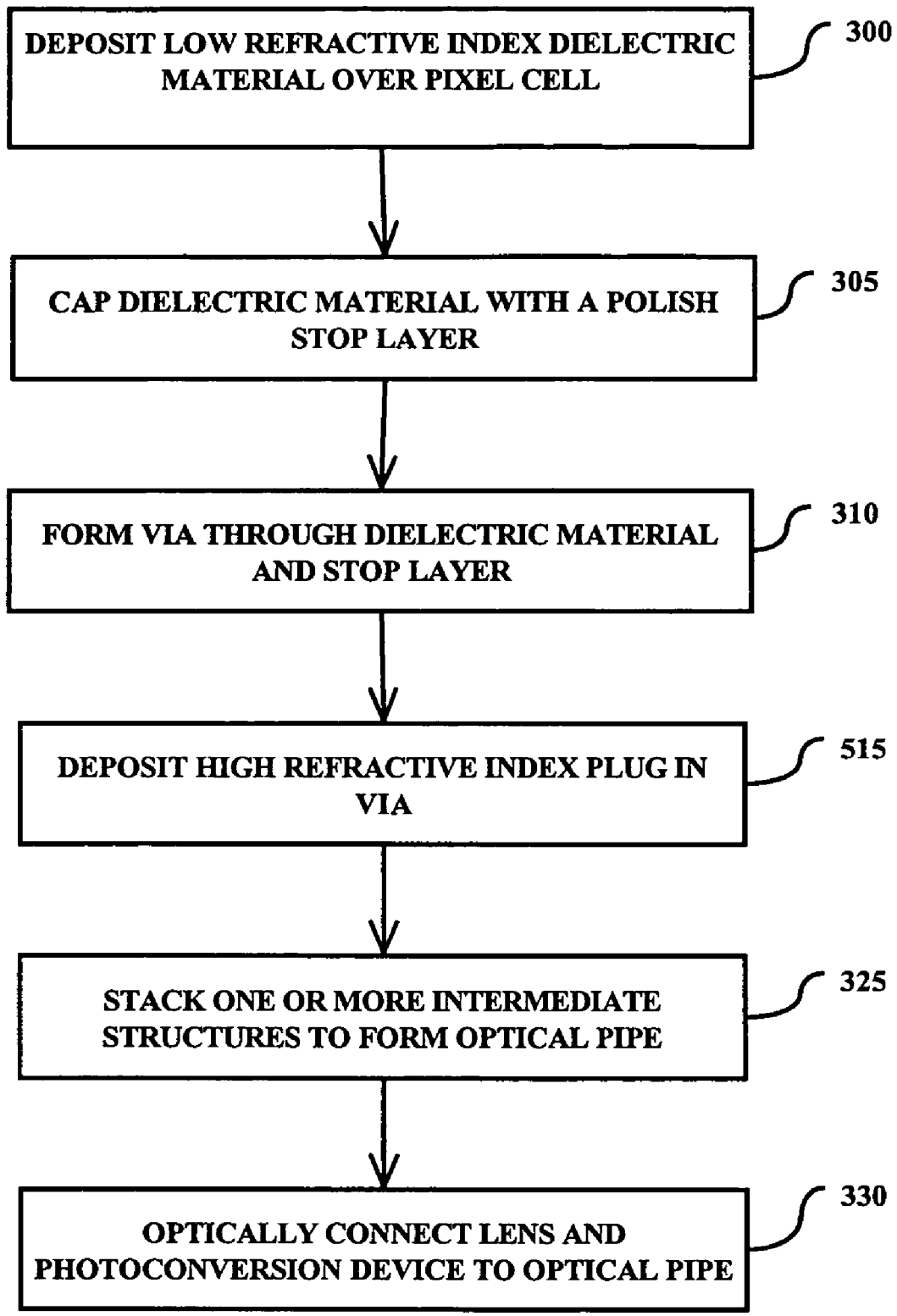
FIG. 10 illustrates a process of forming the multi-level metal optical imager of FIG. 9.

Next will be described with reference to FIGS. 8–10 a second exemplary embodiment of the invention. The second exemplary embodiment follows the process illustrated and described with reference to FIGS. 1–7 through Step 310. Specifically, a single low refractive index dielectric material 12 is capped off with a polish stop layer 14 and a via 16 is etched therethrough. At this point, the second exemplary embodiment diverges from the previously described process by depositing a high refractive index plug 426 within the via 16 at Step 515 (FIG. 10) to form a base intermediate structure 424 (FIG. 8). The high refractive index plug 426 has a higher refractive index than the material used to form the optical channel sections 126, 226. Thereafter, the fabrication process proceeds similarly as the process described above with respect to the FIGS. 1–7. Specifically, one or more intermediate layers 124, 224 are built over the base intermediate structure 424. The exemplary structure illustrated in FIG. 9 stacks two such layers 124, 224, but fewer or more may be employed.

The plug 426 should have a refractive index greater than the refractive indices of both the dielectric material 12 and the optical channel sections 126 and 226. Further, the ratio of the respective refractive indices of the plug 426 to the optical channel section 226 and the dielectric material 12 should be sufficient to cause total internal reflection. Preferably, the plug 426 is formed of a material which exhibits a refractive index similar to the photoconversion device 22, which serves to effectively move the interface with photoconversion device 22 upward. Preferable materials from which the plug 426 is formed include aluminum oxide ($Al_2O_3$), silicon nitride ($Si_3N_4$), and silicon nitride hydrogen ($Si_3N_4$:H).

As noted, the intermediate layers 124 and 224 are built on the intermediate structure 424 in the manner described previously, and the lens 20 and photoconversion device 22 are optically connected through the thus created optical channel 428 (which includes the optical channel sections 126 and 226 and the plug 426) to form a multi-level metal optical imager 230. Since the plug 426 effectively moves the interface of the photoconversion device 22 upwards the length of one of the intermediate structures, a multi-level metal optical imager 230 can be constructed which includes the plug 426 and a plurality of metallized layers which may exceed two such layers.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, it should be appreciated that the dielectric material layers 12, 112, 212 all may be formed of the same material or formed of different materials. Also, it should be appreciated that while the polish stop layers 14, 114, 214 have all been described as being formed of silicon nitride, some or all of the polish stop layers 14, 114, 214 may instead be formed of another material capable of inhibiting chemical-mechanical polishing. Alternatively, the polish stop layers 14, 114, 214 may be omitted entirely. In addition, although the various embodiments of the invention are described with respect to channeling exterior light onto pixel cells of a digital imaging device, the various embodiments would also be used with light emitting devices of display devices to channel light from the light emitting devices to the exterior of the display device. Accordingly, the invention is not to be seen as limited by the foregoing description, but is only limited by the scope of the appended claims.

What is claimed as new and desired to be protected by Letters Patent of the United States is:

1. An optical imager, comprising:
    a lens;
    a light device;
    a first dielectric material comprising first and second dielectric material portions, each of said first and second dielectric material portions capped with a stop layer; and
    a second dielectric material extending through said first dielectric material and said stop layers, said second dielectric material exhibiting a refractive index greater than the refractive index exhibited by said first dielectric material and serving as an optical channel optically connecting said lens with said light device.

2. An optical imager, comprising:
    a lens;
    a light device;
    a first dielectric material comprising first, second, and third dielectric material portions; and
    a second dielectric material extending through said first dielectric material, said second dielectric material exhibiting a refractive index greater than the refractive index exhibited by said first dielectric material and serving as an optical channel optically connecting said lens with said light device.

3. The optical imager of claim 2, wherein each said first, second and third dielectric material portion is capped with a stop layer, said second dielectric material extending through said stop layers.

4. An optical imager, comprising:
    a lens;
    a photogate;
    a first dielectric material; and
    a second dielectric material extending through said first dielectric material, said second dielectric material exhibiting a refractive index greater than the refractive index exhibited by said first dielectric material and serving as an optical channel optically connecting said lens with said light device.

5. An optical coupling between a lens and a light device, comprising:
    a via extending between the lens and the light device;
    a first optical channel section extending through a portion of said via; and
    at least a second optical channel section extending through the remainder of said via;
    wherein said optical channel sections exhibit a refractive index greater than the material surrounding said optical channel sections.

6. The optical coupling of claim 5, wherein said first optical channel section exhibits a similar refractive index as said at least a second optical channel section.

7. The optical coupling of claim 5, wherein said first optical channel section exhibits a different refractive index as said at least a second optical channel section.

8. The optical coupling of claim 5, wherein said optical channel sections are each formed of one or more materials comprising the group consisting of silicon dioxide, silicon nitride, silicates, phosphosilicates, methylsiloxanes, and organic polymers.

9. The optical coupling of claim 5, wherein said at least a second optical channel section comprises a second optical channel section and a third optical channel section.

10. The optical coupling of claim 5, wherein said first optical channel section is an optical plug formed of one or more materials comprising the group consisting of aluminum oxide, silicon nitride, and silicon nitride hydrogen.

11. The optical coupling of claim 10, wherein said at least a second optical channel section comprises a second optical channel section and a third optical channel section.

12. The optical coupling of claim 10, wherein said at least a second optical channel section comprises a second optical channel section, a third optical channel section, and a fourth optical channel section.

13. A multi-level optical imager, comprising:
    a plurality of intermediate structures built over a pixel cell, each intermediate structure comprising:
        a dielectric material portion;
        a stop layer capping said dielectric material portion; and
        an optical channel section extending through said dielectric material portion and said stop layer;
    a lens; and
    a light device within said pixel cell;
    wherein said optical channel sections are aligned with each other to form an optical channel optically connecting said lens with said light device.

14. The multi-level optical imager of claim 13, wherein each of said dielectric material portions of each of said plurality of intermediate structures is formed from the same material.

15. The multi-level optical imager of claim 13, wherein at least one of said dielectric material portions is formed from a different material than the remaining said dielectric material portions.

16. The multi-level optical imager of claim 13, wherein each of said stop layers is formed from the same material.

17. The multi-level optical imager of claim 13, wherein at least one of said stop layers is formed from a different material than the remaining said stop layers.

18. The multi-level optical imager of claim 13, wherein said optical channel sections have a higher refractive index than the refractive index of said dielectric material portions.

19. The multi-level optical imager of claim 18, wherein a ratio of the refractive index exhibited by said optical channel sections to the refractive index exhibited by first dielectric material is sufficient to cause total internal reflection.

20. The multi-level optical imager of claim 19, wherein the refractive index exhibited by one of said optical channel sections is different than the refractive index exhibited by the remaining optical channel sections.

21. The multi-level optical imager of claim 20, wherein said one of said optical channel sections comprises an optical plug.

22. The multi-level optical imager of claim 21, wherein said optical plug is formed of an optically transparent material having a high refractive index and being compatible with semiconductor processing.

23. The multi-level optical imager of claim 22, wherein said optical plug is formed of one or more materials comprising the group consisting of aluminum oxide, silicon nitride, and silicon nitride hydrogen.

24. The multi-level optical imager of claim 13, wherein said optical channel sections are formed of an optically transparent material having a low refractive index and being compatible with semiconductor processing.

25. The multi-level optical imager of claim 24, wherein said optical channel sections are formed of one or more materials comprising the group consisting of silicon dioxide, silicon nitride, silicates, phosphosilicates, methylsiloxanes, and organic polymers.

26. The multi-level optical imager of claim 13, wherein at least one of said plurality of intermediate structures includes a metallized layer surrounded by said dielectric material.

27. The multi-level optical imager of claim 13, wherein said light device comprises a photoconversion device.

28. The multi-level optical imager of claim 27, wherein said photoconversion device comprises a photodiode.

29. The multi-level optical imager of claim 27, wherein said photoconversion device comprises a photogate.

30. The multi-level optical imager of claim 13, wherein the multi-level optical imager comprises a complementary metal oxide semiconductor imager.

31. An optical imager, comprising:
a lens;
a light device; and
at least one metallized layer structure, comprising:
  a first dielectric material;
  a metallized portion within said first dielectric material; and
  a second dielectric material extending through said first dielectric material, said second dielectric material exhibiting a refractive index greater than the refractive index exhibited by said first dielectric material and serving as an optical channel optically connecting said lens with said light device.

32. The optical imager of claim 31, wherein said at least one metallized layer structure comprises first and second metallized layer structures.

33. The optical imager of claim 32, wherein said first metallized layer structure is mounted over said light device and said lens is mounted on said second metallized layer structure.

34. The optical imager of claim 31, wherein said light device comprises a photoconversion device.

35. A multi-level optical imager, comprising:
a first intermediate structure comprising:
  a first dielectric material portion;
  a first stop layer over said first dielectric material portion;
  a first optical channel section extending through said first dielectric material portion and said first stop layer, said first optical channel section including an optical plug;
a second intermediate structure comprising:
  a second dielectric material portion;
  a second stop layer over said second dielectric material portion;
  a second optical channel section extending through said second dielectric material portion and said second stop layer to said optical plug;
a lens mounted on said second intermediate structure; and
a photoconversion device for producing charge from incident light upon which said first intermediate structure is mounted;
wherein said first and second optical channel sections are aligned with each other to form an optical channel optically connecting said lens with said photoconversion device.

36. The multi-level optical imager of claim 35, wherein said first and second optical channel sections exhibit refractive indices greater than the refractive index exhibited by said first and second dielectric material portions.

37. The multi-level optical imager of claim 36, wherein a ratio of the refractive index of said optical channel to the refractive index of said first and second dielectric material portions is sufficient for total internal reflection.

* * * * *